(12) United States Patent
Philip et al.

(10) Patent No.: US 11,177,160 B2
(45) Date of Patent: Nov. 16, 2021

(54) DOUBLE PATTERNED LITHOGRAPHY USING SPACER ASSISTED CUTS FOR PATTERNING STEPS

(71) Applicant: International Business Machines Corporation, Armonk, NY (US)

(72) Inventors: Timothy Mathew Philip, Albany, NY (US); Somnath Ghosh, Clifton Park, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 16/828,551

(22) Filed: Mar. 24, 2020

(65) Prior Publication Data

US 2021/0305089 A1 Sep. 30, 2021

(51) Int. Cl.
*H01L 21/768* (2006.01)
*H01L 21/311* (2006.01)
(Continued)

(52) U.S. Cl.
CPC .... *H01L 21/76802* (2013.01); *H01L 21/0332* (2013.01); *H01L 21/0337* (2013.01);
(Continued)

(58) Field of Classification Search
CPC .............. H01L 21/0337; H01L 21/0332; H01L 21/76816; H01L 21/76811;
(Continued)

(56) References Cited

U.S. PATENT DOCUMENTS

| 8,629,064 B2 | 1/2014 | Li et al. |
| 8,697,538 B1 * | 4/2014 | Chiang ............... H01L 21/0337 438/430 |

(Continued)

OTHER PUBLICATIONS

B. Briggs et al., "N5 Technology Node Dual-Damascene Interconnects Enabled Using Multi Patterning," IEEE International Interconnect Technology Conference (IITC), May 16-18, 2017, 3 pages.

(Continued)

*Primary Examiner* — Bac H Au
(74) *Attorney, Agent, or Firm* — Randall Bluestone; Ryan, Mason & Lewis, LLP

(57) ABSTRACT

A method includes forming a dielectric layer on a semiconductor substrate, forming a first mandrel layer and a second mandrel layer on the dielectric layer and patterning the first mandrel layer and the second mandrel layer to form respective first and second patterns in the first and second mandrel layers. The first pattern includes a first line segment and a first wing segment. The first wing segment is filled with a first spacer material to form a first spacer. The method further includes removing exposed portions of the first and second mandrel layers, transferring an image of the first and second patterns, patterning the dielectric layer and depositing a metal into the patterned dielectric layer to form a metallic interconnect structure. The metallic interconnect structure includes first and second metallic lines with the second metallic line having a line break corresponding to the first spacer.

20 Claims, 6 Drawing Sheets

(51) Int. Cl.
*H01L 23/528* (2006.01)
*H01L 21/033* (2006.01)

(52) U.S. Cl.
CPC ... *H01L 21/31111* (2013.01); *H01L 21/31144* (2013.01); *H01L 21/76877* (2013.01); *H01L 23/528* (2013.01)

(58) Field of Classification Search
CPC ......... H01L 21/76892; H01L 21/76877; H01L 21/76802; H01L 23/528; H01L 21/31111; H01L 21/3086; H01L 21/31144
See application file for complete search history.

(56) References Cited

U.S. PATENT DOCUMENTS

| | | | |
|---|---|---|---|
| 8,987,142 B2 | 3/2015 | Lee et al. | |
| 8,992,792 B2 | 3/2015 | Chang et al. | |
| 9,287,135 B1 | 3/2016 | Doris et al. | |
| 9,524,878 B2* | 12/2016 | Peng | H01L 21/31111 |
| 9,773,676 B2 | 9/2017 | Chang et al. | |
| 9,941,164 B1* | 4/2018 | Kim | H01L 21/31144 |
| 10,157,789 B2 | 12/2018 | Chen et al. | |
| 10,998,193 B1* | 5/2021 | Philip | H01L 21/30604 |
| 2006/0046422 A1* | 3/2006 | Tran | H01L 21/32139 |
| | | | 438/401 |
| 2006/0172540 A1* | 8/2006 | Marks | H01L 21/32139 |
| | | | 438/700 |
| 2007/0048674 A1* | 3/2007 | Wells | H01L 21/76802 |
| | | | 430/313 |
| 2008/0008969 A1* | 1/2008 | Zhou | H01L 23/564 |
| | | | 430/313 |
| 2015/0155198 A1* | 6/2015 | Tsai | H01L 21/0332 |
| | | | 438/674 |
| 2015/0200110 A1 | 7/2015 | Li et al. | |
| 2015/0294905 A1* | 10/2015 | Wu | H01L 21/76831 |
| | | | 257/741 |
| 2017/0018499 A1* | 1/2017 | Chen | H01L 23/5283 |
| 2018/0151416 A1* | 5/2018 | Wu | H01L 21/31144 |
| 2019/0148221 A1* | 5/2019 | Peng | H01L 23/5226 |
| | | | 257/758 |
| 2019/0157082 A1 | 5/2019 | Fan et al. | |
| 2019/0311902 A1* | 10/2019 | Shin | H01L 21/76816 |
| 2019/0318931 A1* | 10/2019 | Shu | H01L 23/5226 |
| 2019/0318968 A1* | 10/2019 | Seo | H01L 21/565 |
| 2020/0111668 A1* | 4/2020 | O'Toole | H01L 21/31111 |

OTHER PUBLICATIONS

Y. Drissi et al., "SALELE Process from Theory to Fabrication," Proceedings of the SPIE, Conference: Design-Process-Technology Co-optimization for Manufacturability XIII, Mar. 21, 2019, 12 pages, vol. 10962.

* cited by examiner

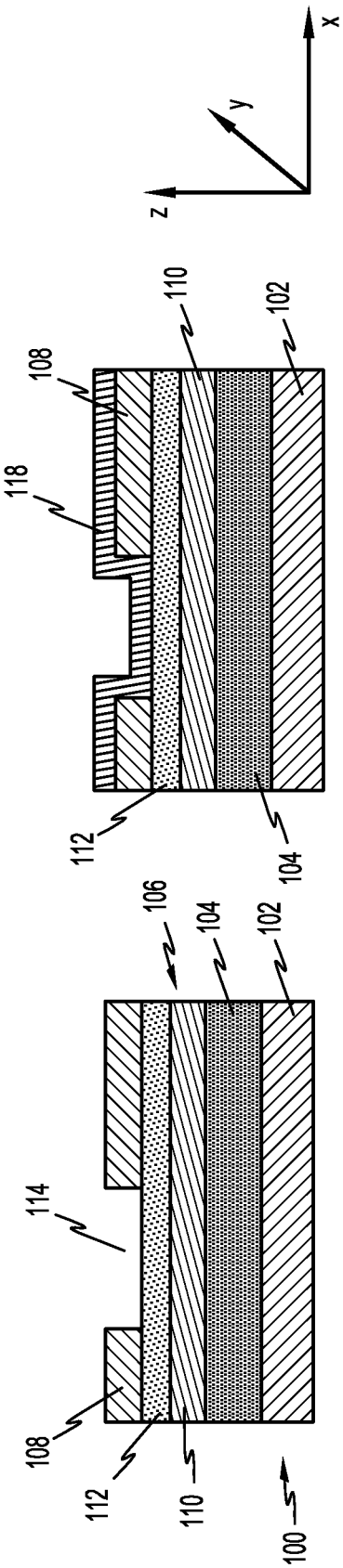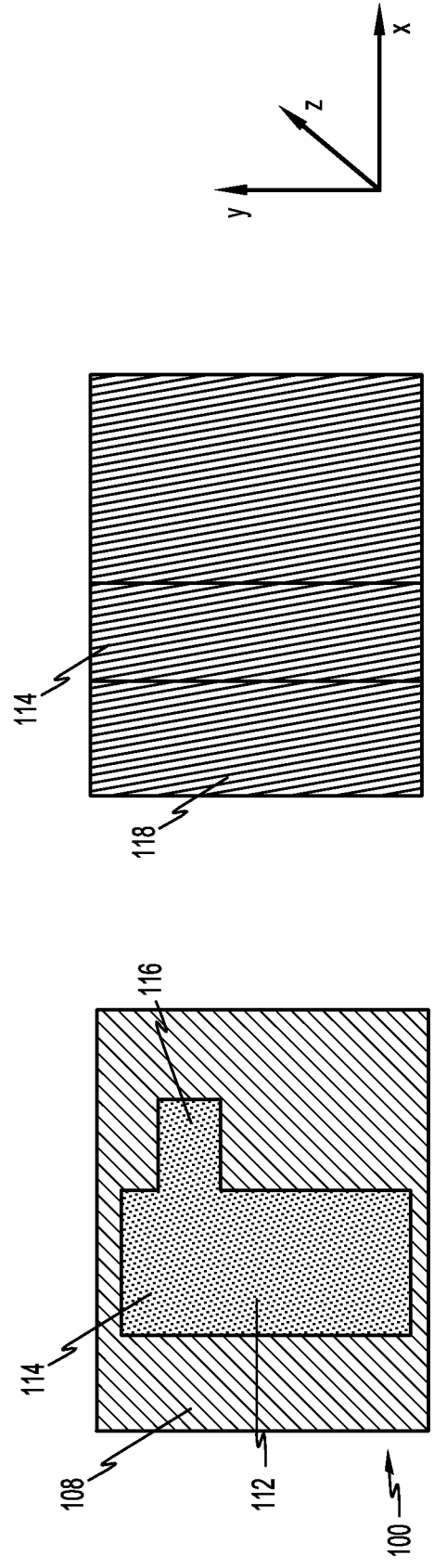

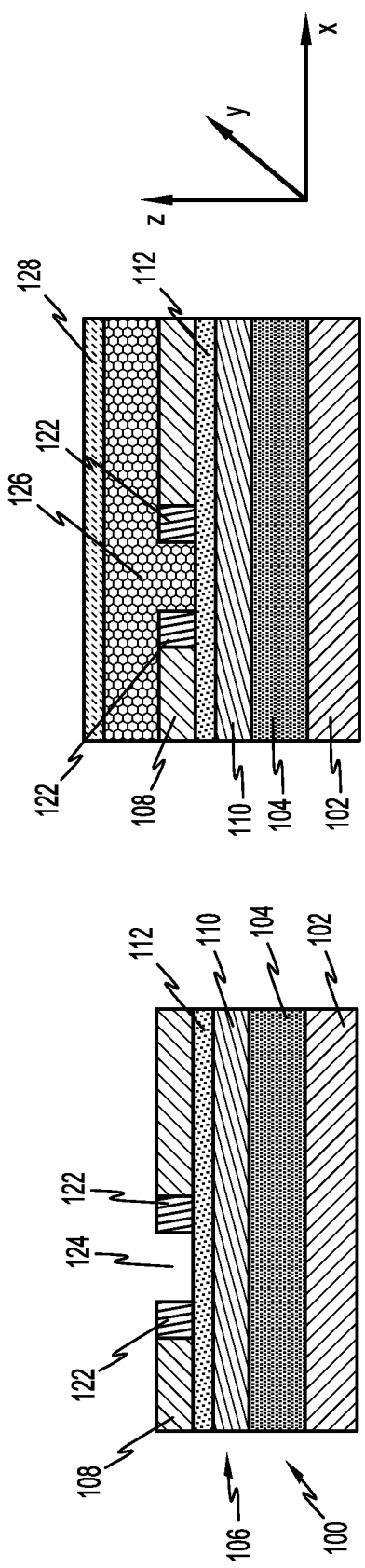
FIG. 5A
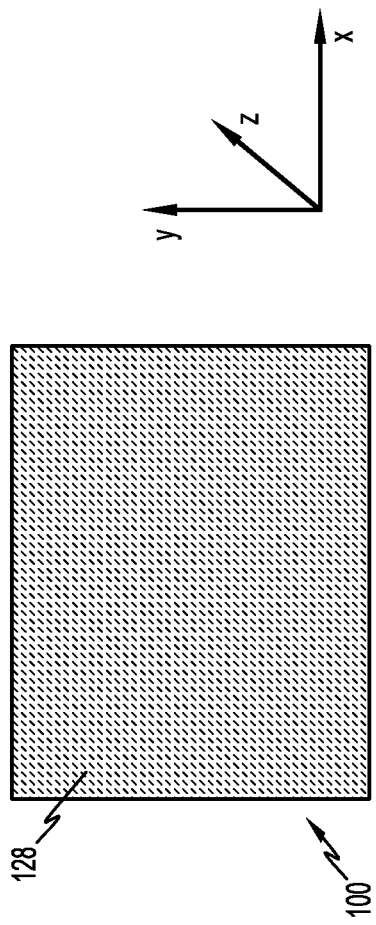
FIG. 4A
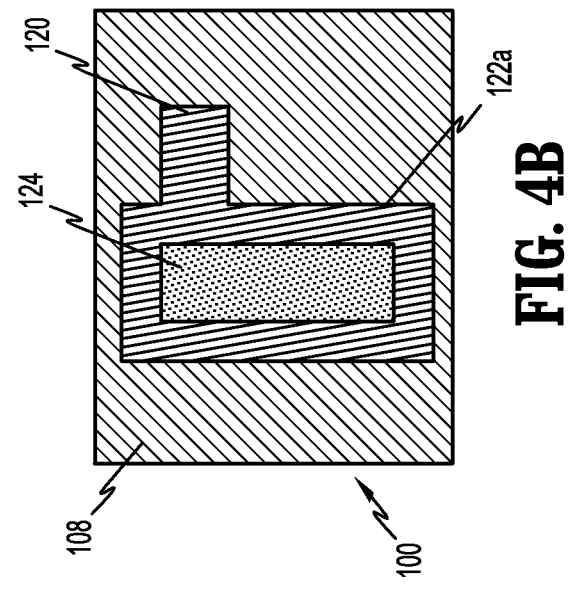
FIG. 5B
FIG. 4B

DOUBLE PATTERNED LITHOGRAPHY USING SPACER ASSISTED CUTS FOR PATTERNING STEPS

BACKGROUND

The present disclosure relates to semiconductor fabrication techniques and, in particular, relates to a back-end-of-line (BEOL) methodology and structure to create spacer assisted metal cuts before metal fill.

A semiconductor device is typically fabricated with a BEOL interconnect structure, which comprises one or more levels of metallic lines and inter-level metal vias, to connect various integrated circuit components and devices that are fabricated as part of a front-end-of-line (FEOL)/middle-of-line (MOL) layer(s) of the semiconductor device. Metal gaps or cuts are formed in the metallic lines in accordance with the desired geometry and intended functionality of the semiconductor device. Various patterning methodologies are utilized in forming the metallic lines to be incorporated into the interconnect BEOL structure. However, conventional methodologies are complex, fail to address scalability concerns and often present misaligned breaks in the metallic lines. Other concerns with conventional methodologies include edge roughness associated with the produced metallic lines along with associated increased line resistances and parasitic capacitance.

SUMMARY

Embodiments of the present application overcome the disadvantages associated with conventional semiconductor processing by providing techniques for self-alignment of metal cuts in a semiconductor component. In one illustrative embodiment, a method comprises forming a dielectric layer on a semiconductor substrate, forming a first mandrel layer above the dielectric layer, and patterning the first mandrel layer to form a first pattern in the first mandrel layer. The first pattern includes a first line segment and a first wing segment depending from the first line segment. The first wing segment is filled with a first spacer material to form a first spacer. The method further comprises forming a second mandrel layer above the first mandrel layer and patterning the second mandrel layer to form a second pattern in the second mandrel layer. The second pattern includes a second line segment. The method further comprises performing at least one etching process selective to the first and second spacer materials to remove exposed portions of the first and second mandrel layers, transferring an image of the first and second patterns relative to the dielectric layer, patterning the dielectric layer in accordance with the image and depositing a metal into the patterned dielectric layer to form a metallic interconnect structure. The metallic interconnect structure includes first and second metallic lines corresponding to the first and second line segments of the first and second patterns. The second metallic line has a line break corresponding to a location of the first spacer.

In another illustrative embodiment, a method comprises forming a dielectric layer on a semiconductor substrate, forming a first hardmask layer on the dielectric layer, forming a first mandrel layer on the first hardmask layer and forming a first recessed profile in the first mandrel layer. The first recessed profile includes a first line segment and a first wing segment. The method further comprises depositing a first spacer material within the first recessed profile wherein the spacer material within the first wing segment defines a first spacer, etching the first spacer material within the first recessed profile to form a first wall of the first spacer material defining a first trench therein, and forming a planarization layer on the first mandrel layer. The planarization layer fills the first trench and extends above the first mandrel layer. The method further comprises forming a second hardmask layer onto the planarization layer, forming a second mandrel layer on the second hardmask layer and forming a second recessed profile in the second mandrel layer. The second recessed profile includes a second line segment and a second wing segment. The method further comprises depositing a second spacer material within the second recessed profile wherein the spacer material within the second wing segment defines a second spacer, etching the second spacer material within the second line segment to form a second wall of spacer material defining a second trench therein and performing at least one etching process selective to the first and second spacer materials and the second hardmask layer to remove exposed portions of each of the first and second mandrel layers, the second hardmask layer and the planarization layer down to the first hardmask layer. The method also comprises etching the first hardmask layer in accordance with a pattern defined at least in part by the first and second walls and the first and second spacers to transfer an image of the pattern into the first hardmask layer, etching the dielectric layer utilizing the etched first hardmask layer as an etch mask, and depositing a metal into the patterned dielectric substrate to form a metallic interconnect structure. The metallic interconnect structure includes a first metallic line corresponding to the first trench of the first pattern and having a first line break corresponding to the second spacer and a second metallic line corresponding to the second trench of the second pattern and having a second line break corresponding to the first spacer.

In another illustrative embodiment, a semiconductor device is disclosed. The semiconductor device comprises a semiconductor substrate including a first spacer material disposed relative to the substrate. The first spacer material includes first spacer wall segments defining a first trench which corresponds to a first metallic line to be formed as part of an interconnect structure. A second spacer material is also disposed relative to the semiconductor substrate above the first spacer material. The second spacer material includes second spacer wall segment defining a second trench which corresponds to a second metallic line to be formed as part of the interconnect structure. The first spacer material includes a first wing segment depending from the first spacer wall segments and in vertical alignment with the second trench. The first wing segment corresponds to a line break in the second metallic line to be formed as part of the interconnect structure. The second spacer material includes a second wing segment depending from the second spacer wall segments and in vertical alignment with the first trench. The second wing segment corresponds to a line break in the first metallic line to be formed as part of the interconnect structure.

BRIEF DESCRIPTION OF THE DRAWINGS

FIG. 2A is a schematic cross-sectional view of the semiconductor structure at a first intermediate stage of fabrication illustrating a first recessed profile of the first mandrel layer according to one or more illustrative embodiments.

FIG. 2B is a top schematic plan view of the semiconductor structure at the first intermediate stage of fabrication of FIG. 2A illustrating a first line segment and a first wing segment of the first recessed profile of the first mandrel layer according to one or more illustrative embodiments.

FIG. 3A is a schematic cross-sectional view of the semiconductor structure at a second intermediate stage of fabrication illustrating a first spacer material deposited in the first recessed profile of the first mandrel layer according to one or more illustrative embodiments.

FIG. 3B is a top schematic plan view of the semiconductor structure at the second intermediate stage of fabrication of FIG. 3A illustrating the first spacer material deposited in the first line segment and the first wing segment of the first recessed profile of the first mandrel layer according to one or more illustrative embodiments.

FIG. 4A is a schematic cross-sectional view of the semiconductor structure at a third intermediate stage of fabrication illustrating the first spacer material within the first line segment etched to define a first trench according to one or more illustrative embodiments.

FIG. 4B is a top schematic plan view of the semiconductor structure at the third intermediate stage of fabrication of FIG. 4A illustrating the first trench and the first spacer material within the first wing segment forming a first spacer according to one or more illustrative embodiments.

FIG. 5A is a schematic cross-sectional view of the semiconductor structure at a fourth intermediate stage of fabrication illustrating a planarization layer deposited on the first mandrel layer and a third hardmask layer deposited on the planarization layer according to one or more illustrative embodiments.

FIG. 5B is a top schematic plan view of the semiconductor structure at the fourth intermediate stage of fabrication of FIG. 5A illustrating the third hardmask layer on the planarization layer according to one or more illustrative embodiments.

DETAILED DESCRIPTION

Figure 1A:
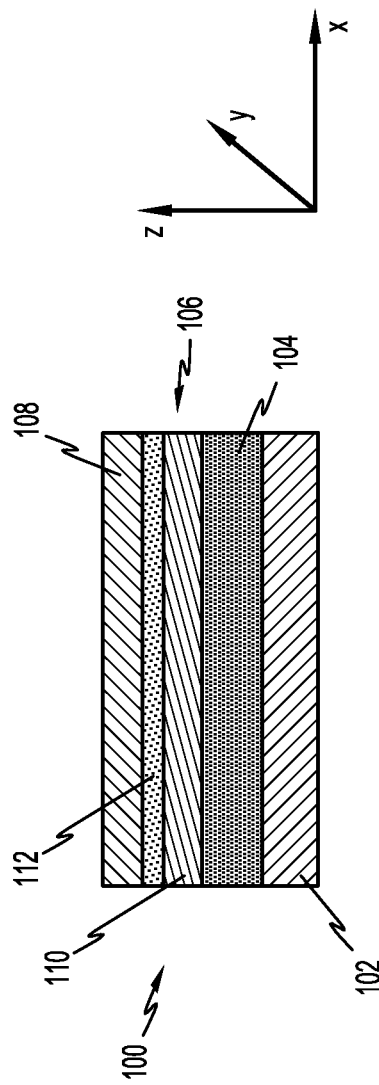
FIG. 1A is a schematic cross-sectional view of a semiconductor structure at an early stage of fabrication including a semiconductor substrate, a dielectric layer formed on the semiconductor substrate, an etch mask including first and second hardmask layers on the dielectric layer, and a first mandrel layer on the etch mask according to one or more illustrative embodiments.

Embodiments will now be described in further detail with regard to semiconductor devices comprising metallic interconnect structures, as well as methods for fabricating metallic interconnect structures with one or more multilevel metallic lines with cuts in the metallic line. Interconnect structures include levels consisting of metallic lines and vias that are often formed using damascene process (via plus next level conductor). The metallic lines and vias are of the same or different conductive material. The conductive materials can be copper, but can be any suitable conductor including, but not limited to cobalt, aluminum, titanium, titanium nitride and/or alloys thereof. Alloys based on copper with an additive metal such as titanium or tin can also be used.

As dimensions such as metallic line pitch within an interconnect structure continue to shrink along with front end of line (FEOL) pitch, the spaces between metallic lines also become limited. For the 7 nanometer (nm) technology node, patterning requirements include a metal pitch of 40 nm or less. This narrow pitch requirement forces the use of spacer-based pitch multiplication techniques. One conventional methodology for manufacturing metal interconnect structures in a BEOL fabrication process is Spacer-Assisted Litho Etch Litho Etch (SALELE). SALELE is a double patterning technique where mandrel lines and non-mandrel lines are patterned on two separate exposure surfaces. The mandrel line cuts are patterned at the same time as the non-mandrels using a spacer pinch off technique. The non-mandrel line cuts are patterned subsequently using a pillaring process. However, the pillaring processes used to make the non-mandrel cut presents issues with respect to pillar "flop over," which results in yield issues and other functional parameter concerns. Moreover, since mandrels are patterned without a spacer, line-edge roughness can be worse for mandrel lines. Furthermore, utilizing spacer pinch-off techniques for the mandrel cuts may result in pinch points on the non-mandrel lines, resulting in increased parasitic capacitance.

Illustrative embodiments provide a method for fabricating a semiconductor device incorporating a Spacer-Assisted Litho-Etch Spacer-Assisted Litho-Etch (SALESALE) double patterning technique to address the shortcomings of conventional methodologies. The contemplated process removes the requirement for pillaring currently incorporated in SALELE fabrication techniques, and the aforedescribed disadvantages associated therewith. As discussed in detail hereinbelow, in accordance with illustrative embodiments, mandrels will be patterned at two times (2×) the target dimensions followed by patterning of the non-mandrel breaks or cuts. A spacer may be deposited to pinch off the non-mandrel cuts. The fabrication process may be used to establish mandrel cuts during non-mandrel patterning to correct misaligned etched openings occurring as a result of photoresist or etching errors.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a BEOL interconnect according to illustrative embodiments utilize a variety of individually known physical and chemical processes performed on a semiconductor (e.g., silicon) substrate, some of which are described in the immediately following paragraphs.

In the discussion that follows, the semiconductor structure, which will incorporate one or more BEOL interconnects, will be referred to as the "semiconductor structure 100" throughout the various stages of fabrication, as represented in all the accompanying drawings. In addition, the following discussion will identify various early or intermediate stages of fabrication of the semiconductor structure 100. It is to be understood that the early or intermediate stages are exemplative only. More or less early or intermediate stages may be implemented in processing the semiconductor structure, and the disclosed stages may be in different order or sequence. In addition, one or more processes may be incorporated within various early or intermediate stages as described herein, and one or more processes may be implemented in early or intermediate stages as otherwise described herein.

Methods for fabricating metallic interconnect structures will now be discussed in further detail with reference to FIGS. 1A through 10B, which schematically illustrate a semiconductor device or structure at various stages of fabrication. To begin, FIG. 1A is a schematic cross-sectional side view of a semiconductor structure 100 along the x-axis at an early stage of fabrication comprising a semiconductor substrate 102, a dielectric layer 104 disposed on the semiconductor substrate 102 and having a planarized upper surface, an etch mask 106 on the dielectric layer 104 and a first sacrificial mandrel layer 108 on the etch mask 106.

The semiconductor substrate 102 of FIG. 1A may include any layer or component (e.g., a semiconductor wafer) and at least one FEOL (front-end-of-line) layer incorporating the various semiconductor devices and components that are formed in or on the active surface of the wafer to provide integrated circuitry for a target application. In FIG. 1A, the semiconductor wafer and the at least one FEOL layer are incorporated into the semiconductor substrate 102. The semiconductor wafer may be a generic wafer layer, and may comprise one of different types of semiconductor substrate materials. For example, in one embodiment, the semiconductor wafer may include a bulk wafer that is formed of silicon (Si) or germanium (Ge), or other types of semiconductor wafer materials that are commonly used in bulk semiconductor fabrication processes such as a silicon-germanium alloy, compound semiconductor materials (e.g., III-V), etc. In another embodiment, the semiconductor substrate may be an active semiconductor layer of an SOI (silicon-on-insulator) material, GeOI (germanium-on-insulator) material, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL.

As noted above, the FEOL component of the semiconductor substrate 102 may comprise various semiconductor devices and components. For example, the FEOL layer may comprise field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor structure 100. In general, FEOL processes typically include preparing the wafer, forming isolation structures (e.g., shallow trench isolation), forming device wells, patterning gate structures, forming spacers, forming source/drain regions (e.g., via implantation), forming silicide contacts on the source/drain regions, forming stress liners, etc.

In the example illustrated in FIG. 1A, the dielectric layer 104 is formed as part of an initial or later phase of a BEOL process module to form one or more metallization layers of a BEOL interconnect structure. The dielectric layer 104 comprises a dielectric material including a layer of ultra "low k" insulating/dielectric material such as silicon oxide (e.g., SiO2), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF). carbon doped oxide (CDO), SiOC films or SiOCH low-k films and other similar types of insulating/dielectric materials or porous dielectrics which are non-reactive with the metallic material that is used to form metallic interconnect structures in the BEOL. The dielectric layer 104, in one illustrative embodiment designed to minimize capacitive coupling, has a dielectric constant of 3.0 or less. The height of the dielectric layer 104 defines a vertical height (or thickness) along the z-axis of the metallization that is formed within the first dielectric layer 104, which will vary depending on the application. For example, in one embodiment, the dielectric layer 104 is formed with a thickness or vertical height in a range of about 20 nm to about 800 nm. The dielectric layer 104 is formed using known deposition techniques, such as, for example, ALD (atomic layer deposition), CVD (chemical vapor deposition) PECVD (plasma-enhanced CVD), or PVD (physical vapor deposition), or spin-on deposition.

The etch mask 106 may comprise one or more hardmask layers. In one illustrative embodiment, the etch mask 106 includes a first hardmask layer 110 and a second or additional hard mask layer 112 fabricated from a different material than the first hard mask layer 110. Alternatively, the etch mask 106 may comprise a single hardmask layer. The first hardmask layer 110 may comprise a titanium nitride (TiN) layer, and the second hardmask layer 112 may comprise an oxide layer such as tetraethyl orthosilicate (TEOS). Other materials for the first and second hardmask layers 110, 112 are also envisioned including, for example, other metal oxides such as Al-based or Ta-based metal oxide or nitride/oxynitride, and the like. The first and second hardmask layers 110, 112 may be deposited using any known techniques including, for example, by a PEALD (plasma enhanced atomic layer deposition) process, a PECVD (plasma-enhanced chemical vapor deposition) process, a PVD (physical vapor deposition) process, CVD (chemical vapor deposition) process, an ALD (atomic layer deposition) process, etc. The deposition process may be performed using a starting precursor having titanium (Ti), oxygen (O), carbon (C) and nitrogen (N) in the deposition chamber. Additionally, parameters related to deposition may be altered in order to improve the wet etch rate of the resulting structure.

Figure 1B:
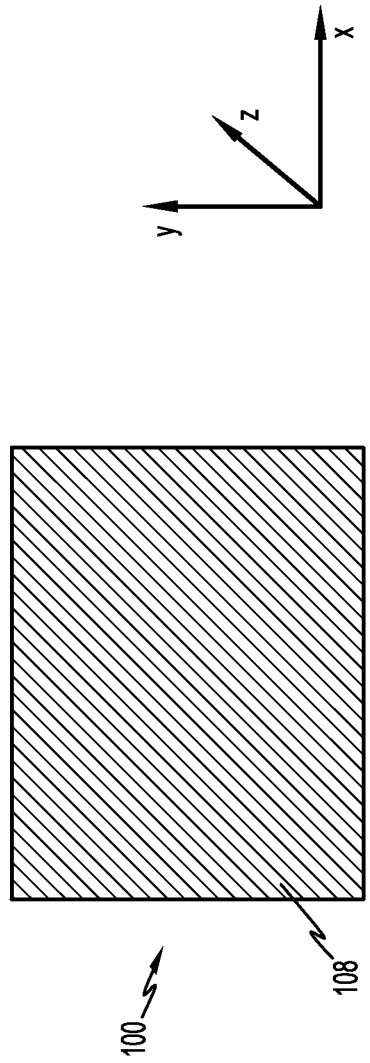
FIG. 1B is a top schematic plan view of the semiconductor structure at the early stage of fabrication of FIG. 1A illustrating the first mandrel layer according to one or more illustrative embodiments.

The first sacrificial mandrel layer 108 is deposited on the etch mask 106. The first sacrificial mandrel layer 108 may comprise an undoped amorphous silicon layer (a-Si) or a polycrystalline silicon layer. The first sacrificial mandrel layer 108 may be deposited using known dry deposition techniques such as ALD (atomic layer deposition), PVD (physical vapor deposition), CVD (chemical vapor deposition) or wet deposition techniques such as electroplating, and electroless plating, etc. The fill material of the first sacrificial mandrel layer 108 may be subjected to a planarization process, e.g., such as a CMP (chemical-mechanical polish) process utilizing a suitable etch slurry. The fill material forms the first sacrificial mandrel layer 108. FIG. 1B illustrates the first sacrificial mandrel layer 108 on as the upper component of the semiconductor structure 100 at this early stage of fabrication.

Referring now to FIGS. 2A-2B, a first intermediate stage of fabrication of the semiconductor structure 100 is illustrated. In accordance with this stage, using conventional photolithography and etching processes, a first pattern or recessed profile is patterned within the first sacrificial mandrel layer 108. The first recessed pattern or profile is used in part to eventually form the first metallic line of the interconnect structure and also a line break in a second metallic line of the interconnect structure. In illustrative embodiments, the first pattern defines a first recessed line segment 114 and a first recessed wing segment 116 depending from the first recessed line segment 114. The first recessed wing segment 116 may be formed in a second lithographic and etching step. The first recessed line segment 114 is generally linear as depicted in FIG. 2B. In illustrative embodiments, the first recessed line segment 114 is formed at a target dimension "W+2S" where "W" corresponds to the desired width of the first metallic line projected to be formed in the interconnect structure and "S" corresponds to the desired spacing between adjacent metallic lines of the interconnect structure. The width "W" may range from about 5 nm to about 25 nm. The spacing "S" may range from about 5 nm to about 25 nm. The first recessed wing segment 116 depends from the first recessed line segment 114. The first recessed wing segment 116 will be used to form a line cut or break in a second adjacent metallic line of the projected interconnect structure as will be discussed hereinbelow. The first wing segment 116 defines a width generally corresponding to the final width of the second adjacent metallic line. In illustrative embodiments, the first pattern or first reduced profile are formed utilizing an etching process selective to the underlying second hardmask layer 112.

Referring now to FIGS. 3A-3B, a second intermediate stage of fabrication of the semiconductor structure 100 is illustrated. At this stage, a first conformal spacer material 118 is deposited within the first pattern or first recessed profile of the first sacrificial mandrel layer 108 to at least partially, for example, completely fill the first recessed line segment 114 and the first recessed wing segment 116. The first conformal spacer material 118 may include a conformal oxide layer or any other suitable sacrificial material, and may be deposited using known deposition techniques. The first conformal spacer material 118 may be subjected to a planarization process to align the upper surface of the deposited first spacer material 118 with the upper surface of the first sacrificial mandrel layer 108. The first conformal spacer material 118 pinches off the first recessed wing segment 116 within the first pattern and forms a first spacer.

Referring now to FIGS. 4A-4B, a third intermediate stage of fabrication of the semiconductor structure 100 is illustrated. The first spacer material 118 is subjected to one or more lithographic and etching processes such as a directionally etching process, including, e.g., reactive ion etching to expose the first spacer 120 of the conformal spacer material 118. The first spacer 120 provides a line break or cut in an adjacent metallic line in the projected interconnect structure. In addition, the first spacer material within the first recessed line segment 114 of the first pattern or first reduced profile is also subjected to the one or more lithographic and etching processes, to form sidewall first spacer walls 122 which collectively define a first trench 124 between the first spacer walls 122. The etching process may be selective to the underlying second hard mask layer 112. The first trench 124 is selectively dimensioned to define a width and a length corresponding respectively to the width and length of the first metallic line to be formed in the interconnect structure. In addition, the width of the first spacer walls 122, for example, first spacer wall 122a, corresponds to the spacing or distance between the first and second metallic lines in the projected interconnect structure. FIG. 4B also illustrates the first spacer 120.

With reference now to FIGS. 5A-5B, a fourth intermediate stage of fabrication of the semiconductor structure 100 is illustrated. A planarization material including a sacrificial material, for example, an organic planarization material, is deposited onto the semiconductor structure 100, specifically, the first sacrificial mandrel layer 108 to form a planarization layer 126, e.g., an organic planarization layer (OPL). The planarization material fills the first trench 124 and extends above the surface of the first sacrificial mandrel layer 108. In illustrative embodiments, the organic planarization material, is deposited from solution, e.g., by any conventional deposition process, and is baked at high temperature. The planarization material may be self-leveling and achieve planarization over the surface topography without the use of etching, chemical mechanical polishing, or other conventional planarization techniques. The planarization material can include an organic polymer made up of a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the planarization layer 126 may be made up of any organic polymer having a molecular structure that can attach to the material of the underlying second hard mask layer 112. The OPL layer may have a thickness ranging from about 50 nm to about 500 nm. In other illustrative embodiments, the OPL material may be replaced with an oxide (such as silicon dioxide, spin on glass-based oxide, etc.)

With continued reference to FIGS. 5A-5B, a third hardmask layer 128 is then formed on the planarization layer 126. The third hard mask layer 128 may include any suitable material, such as, for example, a metal oxide including titanium oxide (TiOx), SiARC, SiON, SiO2 TiARC, etc. and can have a thickness of about 5 nm to about 50 nm. In some embodiments, the third hard mask layer 128 is a TiOx layer having a thickness of about 25 nm. The third hardmask layer 128 may be deposited on the planarization layer 126 using any of the aforementioned techniques utilized for depositing the first and second hardmask layers 110, 112 of the etch mask 106.

Figure 6A:
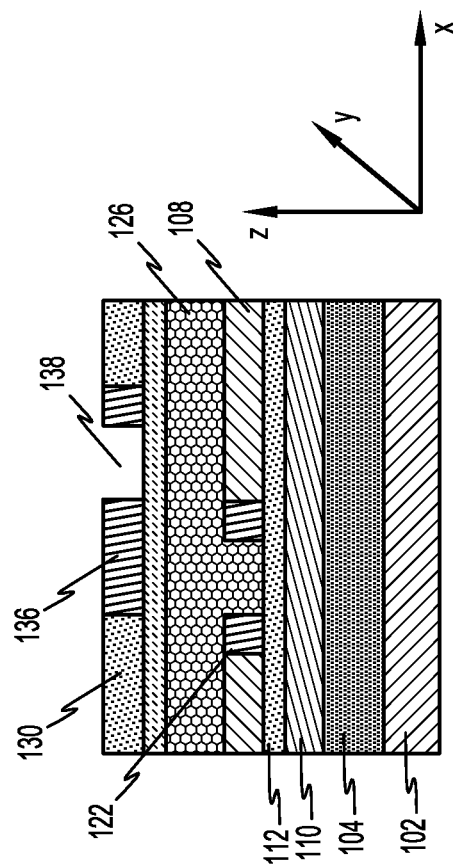
FIG. 6A is a schematic cross-sectional view of the semiconductor structure at a fifth intermediate stage of fabrication illustrating deposition of a second mandrel layer on the third hardmask layer, and further illustrating a second recessed profile formed in the second mandrel layer according to one or more illustrative embodiments.
Figure 6B:
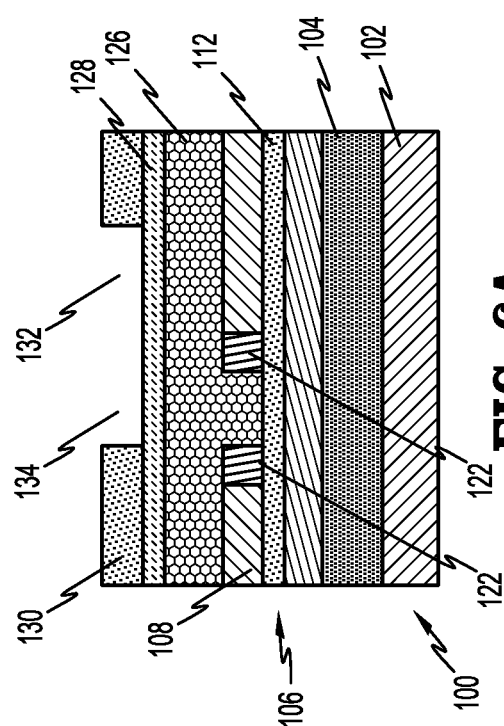
FIG. 6B is a top schematic plan view of the semiconductor structure at the fifth intermediate stage of fabrication of FIG. 6A illustrating a second line segment and a second wing segment of the second recessed profile of the second mandrel layer according to one or more illustrative embodiments.

Referring now to FIGS. 6A-6B, a fifth intermediate stage of fabrication of the semiconductor structure 100 is illustrated. Subsequent to formation of the third hardmask layer 128, a second sacrificial mandrel material is deposited on the third hardmask layer 128 to form a second sacrificial mandrel layer 130. The material of the second sacrificial mandrel layer 130 may comprise the same material as the first sacrificial mandrel layer 108 and is deposited via similar deposition processes. In the alternative, the material of the second sacrificial mandrel layer 130 may comprise titanium nitride (TiN), silicon nitride (SiN) or amorphous silicon (aSi). Once the second sacrificial mandrel layer 130 is formed, using conventional lithographic and etching processes, a second recessed profile or pattern is formed in the second sacrificial mandrel layer 130. Similar to the first pattern discussed hereinabove in connection with the first sacrificial mandrel layer 108, the second pattern or recessed profile includes a second recessed line segment 132 and a second recessed wing segment 134. The second recessed line segment 132 corresponds to the second metallic line to be formed in the interconnect structure. The second recessed wing segment 134 corresponds to a location of a line break to be formed in the first metallic line of the interconnect structure. The second recessed wing segment 134 may be formed in an additional lithographic and etching step. The dimensions of the second recessed line segment 132 and the second recessed wing segment 134 may be substantially similar to the dimensions of the respective first recessed line segment 114 and the first recessed wing segment 116.

Figure 7A:
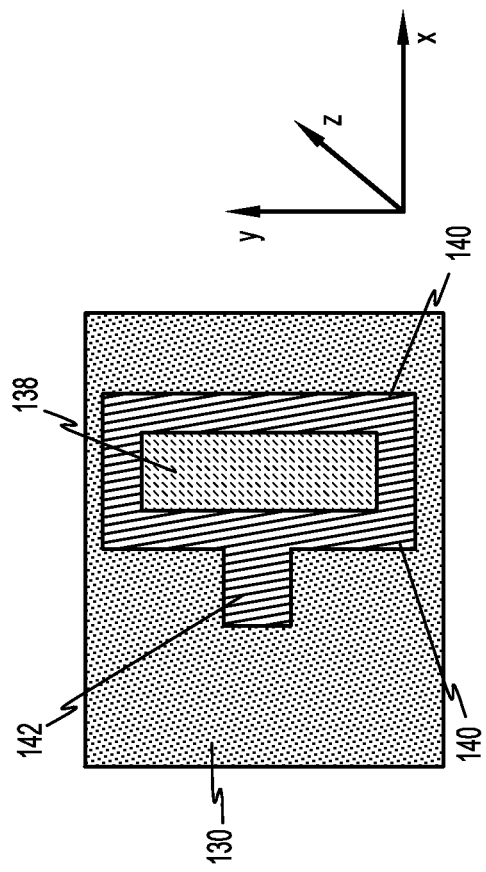
FIG. 7A is a schematic cross-sectional view of the semiconductor structure at a sixth intermediate stage of fabrication illustrating a second spacer material deposited in the second recessed profile of the second mandrel layer, and further illustrating the second spacer material within the second line segment etched to define a second trench according to one or more illustrative embodiments.
Figure 7B:
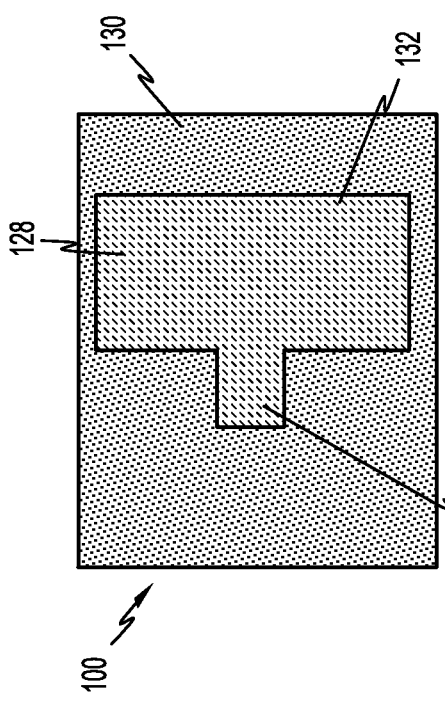
FIG. 7B is a top schematic plan view of the semiconductor structure at the sixth intermediate stage of fabrication of FIG. 7A illustrating the second trench and the second spacer material within the second wing segment forming a second spacer according to one or more illustrative embodiments.

With reference now to FIGS. 7A-7B, a sixth intermediate stage of fabrication of the semiconductor structure 100 is illustrated. A second spacer material 136 is deposited within the second pattern or second recessed profile of the second sacrificial mandrel layer 130 to at least partially fill or completely fill the second recessed line segment 132 and the second recessed wing segment 134 of the second pattern. The second spacer material 136 may be the same conformal oxide layer of the first spacer material described hereinabove, and may be subjected to the same deposition processes and planarization processes discussed hereinabove. Alternatively, the second spacer material 136 may be different from the first spacer material 118. Thereafter, similar to the processes discussed in FIGS. 4A-4B in connection with the first spacer material 118, the second spacer material 136 within the second recessed line segment 132 is subjected to an etching process selective to the material of the underlying third hard mask layer 128 to create a second trench 138 surrounded, or defined by, second spacer walls 140 of the second spacer material 136. The second trench 138 will correspond to the second metallic line of the projected interconnect structure. The second spacer material 136 also fills and pinches off the second recessed wing segment 134 to form a second spacer 142. The second spacer 142 corresponds to the line break in the first metallic line to be formed in the projected interconnect structure. The width and length of the second trench 138 may be substantially similar to the corresponding dimensions of the first trench 124 formed within the first sacrificial mandrel layer 108. Similarly, the dimensions of the second spacer 142 may be similar to the dimensions of the first spacer 120 of the first spacer material 118.

Figure 8A:
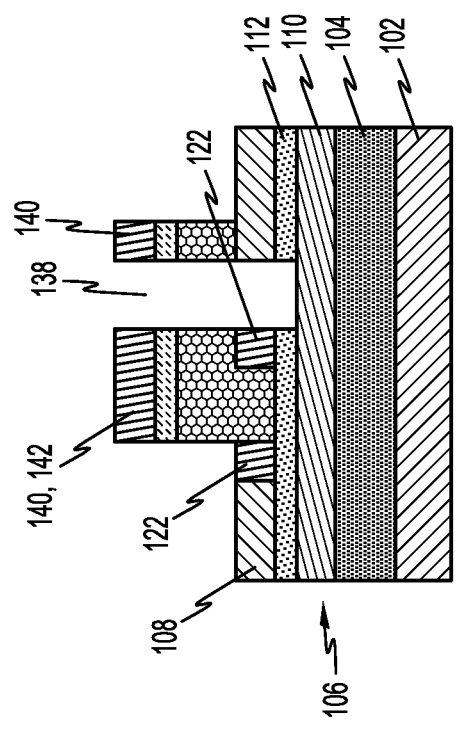
FIG. 8A is a schematic cross-sectional view of the semiconductor structure at a seventh intermediate stage of fabrication illustrating the semiconductor structure subjected to one or more etching processes according to one or more illustrative embodiments.
Figure 8B:
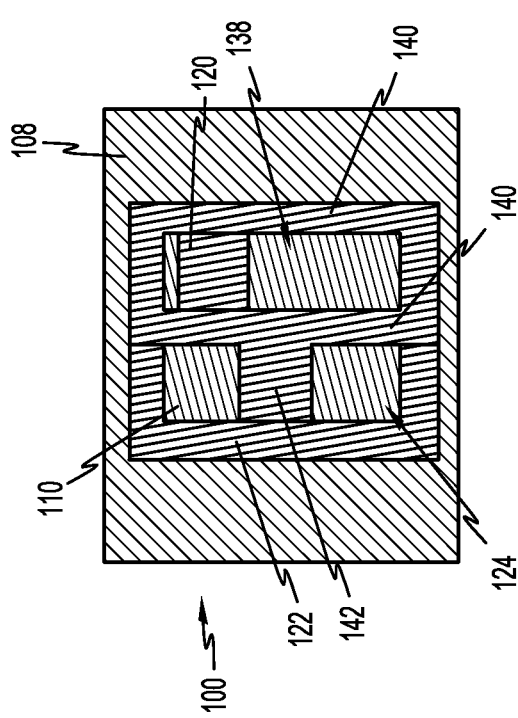
FIG. 8B is a top schematic plan view of the semiconductor structure at the seventh intermediate stage of fabrication of FIG. 8A illustrating the first and second trenches and the first and second spacers forming a composite pattern according to one or more illustrative embodiments.

Referring now to FIGS. 8A-8B, a seventh intermediate stage of fabrication of the semiconductor structure 100 is illustrated. FIG. 8A is a cross-sectional view taken through the second spacer 142 of the semiconductor structure 100 of FIG. 8B. The semiconductor structure 100 is subjected to one or more etching processes selective to the material of the first and second spacer materials 118, 136 and the first hard mask layer 110 to transfer the composite first and second patterns down through the second hard mask layer 112 terminating at the first hard mask layer 110. Notably, the material below the second spacer material 136 including the second spacer walls 140 and the second spacer 142 is preserved. FIGS. 8A-8B illustrate the first spacer walls 122 of the first spacer material 118 defining the first trench 124, and also depicts the first spacer 120 disposed in vertical alignment with the second trench 138 defined by the second spacer walls 140. Also depicted in FIG. 8B is the second spacer 142 of the second profile which is vertically aligned with, but above, the first trench 124. It is noted in the top view of FIG. 8B, the second spacer walls 140 and the second spacer 142 are continuous. The first spacer walls 122 of the first spacer material 118 are disposed below the second spacer walls 140 and below the second spacer 142. The first spacer 120 of the first spacer material 118 is also distinct from the second spacer walls 140 and also is disposed below the second spacer walls 140.

Figure 9A:
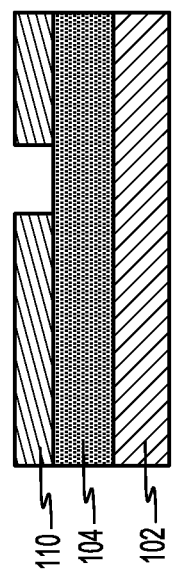
FIG. 9A is a schematic cross-sectional view of the semiconductor structure at an eighth intermediate stage of fabrication illustrating the first hard mask layer etched in accordance with the composite pattern according to one or more illustrative embodiments.
Figure 9B:
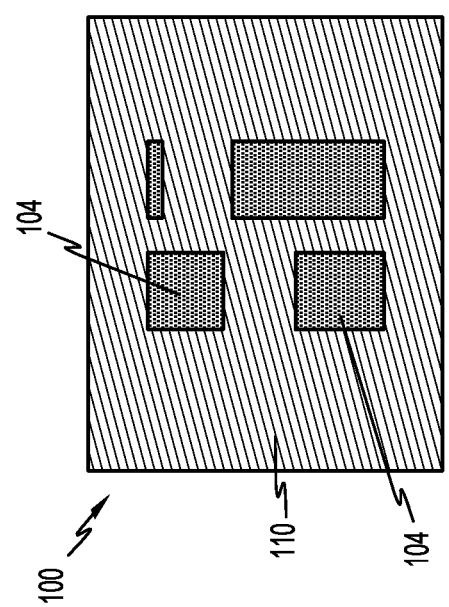
FIG. 9B is a top schematic plan view of the semiconductor structure at the eighth intermediate stage of fabrication of FIG. 9A illustrating the first hardmask layer etched in accordance with the composite patterns to form the etch mask according to one or more illustrative embodiments.

Referring now to FIGS. 9A-9B, an eighth intermediate stage of fabrication of the semiconductor structure 100 is illustrated. The composite first and second pattern is transferred into the first hard mask layer 110 via conventional etching processes. Thereafter, the remaining materials above the first hard mask layer 110 are removed through one or more removal processes including an etching process such as an ash etching processes and/or other conventional stripping processes. Various etching processes may include N2/H2, or CO/CO2 ash or a nitrogen or hydrogen-based chemistry including, for example, nitrogen gas or hydrogen gas, or a combination thereof.

Figure 10A:
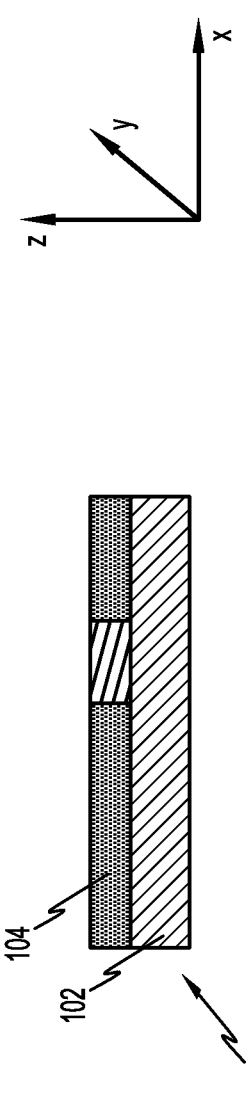
FIG. 10A is a schematic cross-sectional view of the semiconductor structure at a ninth intermediate stage of fabrication illustrating the dielectric layer etched in accordance with the etch mask and subsequent to metallization according to one or more illustrative embodiments.
Figure 10B:
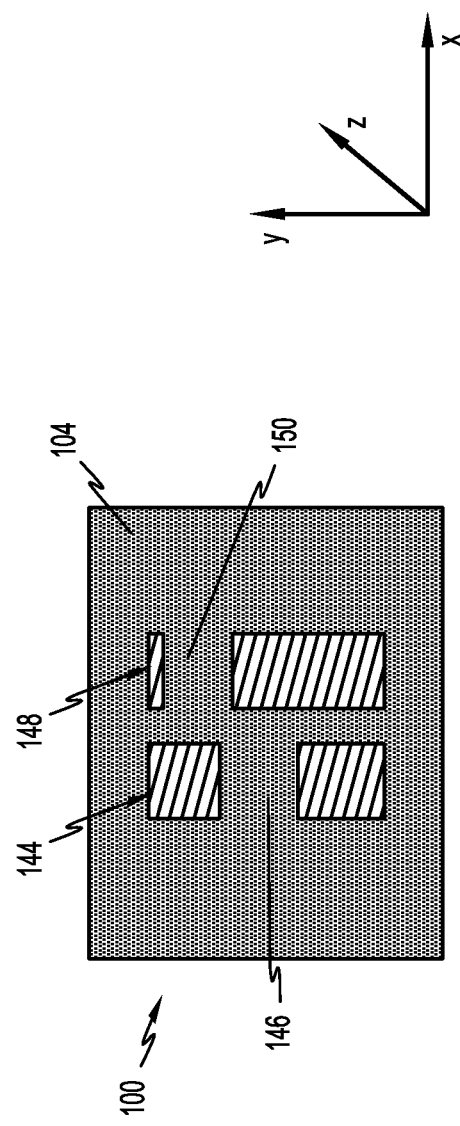
FIG. 10B is a top schematic plan view of the semiconductor structure at the ninth intermediate stage of fabrication of FIG. 10A illustrating the first and second metallic lines with line breaks according to one or more illustrative embodiments.

With reference now to FIGS. 10A-10B, a ninth intermediate stage of fabrication of the semiconductor structure 100 is illustrated. Using the first hard mask layer 110 as an etch hardmask, a directional wet or dry etch process is then performed to etch and transfer the composite first and second patterns to the underlying dielectric layer 104 thereby forming the patterning for the first and second metallic lines of the interconnect structure. A metallization process is performed to deposit metal into the patterned interlayer layer 104 thereby forming the interconnect structure. The interconnect structure includes a first linear metallic line 144 corresponding to the first trench 124 in the first sacrificial mandrel layer 108 with a line break 146 corresponding to the second spacer 142 formed by the second spacer material 136 deposited within the second sacrificial mandrel layer 130. The pattern further includes a second linear metallic line 148 corresponding to the second trench 138 in the second sacrificial mandrel layer 130 with a line break 150 corresponding to the first spacer 120 formed by the first spacer material 118 deposited within the first sacrificial mandrel layer 108. In addition, the first and second metallic lines 144, 148 are spaced a distance corresponding to the width of the spacer walls 122, 140 of either or both of the first and second spacer materials 118, 136.

Metal utilized in the metallization process may include cobalt, titanium, copper, aluminum tungsten, iridium, ruthenium, or alloys thereof. The metallization layer can be formed by CVD, sputtering, electrochemical deposition or like processes. For example, the deposition of copper can proceed by electrochemical deposition such as electroplating or electroless plating. Following formation of the metal layer, the metallization layer may be subjected to a planarization process to remove any metal overburden such that a top surface of the metal, for example, copper, is substantially coplanar to the dielectric layer 104.

Thus, illustrative embodiments provide a mechanism to fabricate at least first and second metallic lines in a dielectric layer in accordance with a BEOL fabrication procedure. The processes described herein are not limited to formation of two metallic lines. More than two metallic lines may be part of the metallic interconnect with a first set of a plurality of metallic lines being odd lines and a second set of a plurality of metallic lines being even lines of the interconnect. In addition, the procedure may be repeated with a sacrificial third mandrel layer, etc. to form one or more additional third metallic lines. The aforedescribed Spacer-Assisted Litho-Etch Spacer-Assisted Litho-Etch (SALESALE) double patterning technique addresses shortcomings of conventional methodologies, removes the requirement of pillaring and the disadvantages associated therewith. Line breaks are created in the metallic lines through the use of spacers, which are readily aligned with the trenches eventually forming the metallic lines thereby facilitating the manufacturing process.

It is to be understood that the methods discussed herein for fabricating low-resistivity metallic interconnect structures (e.g., copper BEOL interconnect structures) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

The descriptions of the various illustrative embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a dielectric layer on a semiconductor substrate, the semiconductor substrate defining a longitudinal axis;
   forming a first mandrel layer above the dielectric layer;
   patterning the first mandrel layer to form a first pattern in the first mandrel layer, the first pattern including a first line segment and a first wing segment depending from the first line segment, the first wing segment filled with a first spacer material to form a first spacer;
   forming a second mandrel layer above the first mandrel layer;
   patterning the second mandrel layer to form a second pattern in the second mandrel layer, the second pattern including a second line segment;
   performing at least one etching process selective to the first spacer to remove exposed portions of the first and second mandrel layers;
   transferring an image of the first and second patterns relative to the dielectric layer;
   patterning the dielectric layer in accordance with the image; and
   depositing a metal into the patterned dielectric layer to form a metallic interconnect structure, the metallic interconnect structure including first and second metallic lines corresponding to the first and second line segments of the first and second patterns, the second metallic line having a line break corresponding a location of the first spacer;
   wherein patterning the first mandrel layer includes:
       depositing the first spacer material within the first line segment and the first wing segment in the first mandrel layer; and
       removing portions of the first spacer material within the first line region of the first mandrel layer to define a first line trench surrounded by a first wall of the spacer material, the first line trench defining the first metallic line.

2. The method of claim 1 wherein patterning the second mandrel includes forming a second wing segment depending from the second line segment; and
   further includes depositing a second spacer material within the second line segment and the second wing segment, the second spacer material within the second wing segment forming a second spacer; and
   wherein depositing the metal forms the interconnect structure, the first metallic line having a line break corresponding to the second spacer.

3. The method of claim 2 including:
   forming a first hardmask layer on the dielectric layer;
   transferring the image of the first and second patterns onto the first hardmask layer to form an etch mask; and
   etching the dielectric layer in accordance with the etch mask.

4. The method of claim 3 wherein patterning the second mandrel layer includes:
   removing portions of the second spacer material within the second line segment of the second mandrel layer to define a second line trench surrounded by a second wall of the second spacer material, the second line trench defining the second metallic line.

5. The method of claim 4 wherein removing portions of the first spacer material and removing portions of the second spacer material includes at least one etch process.

6. The method of claim 3 including forming an additional hardmask layer onto the first hardmask layer, the additional hardmask layer comprising a material different from a material of the first hardmask layer.

7. The method of claim 2 wherein the first spacer material and the second spacer material comprise an oxide.

8. The method of claim 2 wherein the first mandrel layer and the second mandrel layer comprise an amorphous silicon.

9. The method of claim 1 including depositing a planarization layer onto the first mandrel layer to fill the first trench.

10. The method of claim 9 wherein the planarization layer comprises an organic planarization layer.

11. The method of claim 9 including forming a second hardmask layer onto the planarization layer, the second mandrel layer being disposed above the second hardmask layer.

12. The method of claim 1 wherein patterning the first mandrel includes forming the first wall of the first spacer material whereby a width of the first wall corresponds to a spacing between the first and second metallic lines of the formed metallic interconnect structure.

13. A method, comprising:
   forming a dielectric layer on a semiconductor substrate;
   forming a first hardmask layer on the dielectric layer;
   forming a first mandrel layer on the first hardmask layer;
   forming a first recessed profile in the first mandrel layer, the first recessed profile including a first line segment and a first wing segment;
   depositing a first spacer material within the first recessed profile wherein the spacer material within the first wing segment defines a first spacer;
   etching the first spacer material within the first recessed profile to form a first wall of the first spacer material defining a first trench therein;
   forming a planarization layer on the first mandrel layer, the planarization layer filling the first trench and extending above the first mandrel layer;
   forming a second hardmask layer onto the planarization layer
   forming a second mandrel layer on the second hardmask layer;

forming a second recessed profile in the second mandrel layer, the second recessed profile including a second line segment and a second wing segment;

depositing a second spacer material within the second recessed profile wherein the spacer material within the second wing segment defines a second spacer;

etching the second spacer material within the second line segment to form a second wall of spacer material defining a second trench therein;

performing at least one etching process selective to the first and second spacer materials and the second hardmask layer to remove exposed portions of the first and second mandrel layers, the second hardmask layer and the planarization layer down to the first hardmask layer;

etching the first hardmask layer in accordance with a pattern defined at least in part by the first and second walls and the first and second spacers to transfer an image of the pattern into the first hardmask layer;

etching the dielectric layer utilizing the etched first hardmask layer as an etch mask; and depositing a metal into the patterned dielectric substrate to form a metallic interconnect structure, the metallic interconnect structure including:

a first metallic line corresponding to the first trench of the first pattern and having a first line break corresponding to the second spacer; and a second metallic line corresponding to the second trench of the second pattern and having a second line break corresponding to the first spacer.

14. The method of claim 13 wherein etching the first spacer material includes forming the first wall whereby the first wall defines a width corresponding to a spacing between the first and second metallic lines.

15. The method of claim 13 wherein the first spacer material and the second spacer material comprise an oxide.

16. The method of claim 13 wherein the first mandrel layer and the second mandrel layer comprise amorphous silicon.

17. The method of claim 13 including forming an additional hardmask layer onto the first hardmask layer, the additional hardmask layer comprising a material different from a material of the first hardmask layer.

18. The method of claim 13 wherein the planarization layer comprises an organic planarization layer.

19. A method, comprising:
a. forming a dielectric layer on a semiconductor substrate;
b. forming at least one mandrel layer above the dielectric layer;
c. patterning the at least one mandrel layer to form a recessed profile of the at least one mandrel layer, the recessed profile including a recessed line segment and a recessed wing segment depending from the recessed line segment;
d. depositing a spacer material within the recessed line segment and the recessed wing segment;
e. removing portions of the spacer material within the line segment of the recessed profile of the mandrel layer to define a line trench surrounded by a spacer wall of the spacer material and a wing spacer extending from the spacer wall;
f. removing exposed portions of the at least one mandrel layer;
g. transferring an image of a pattern defined at least in part by the spacer wall and the wing spacer to relative to the dielectric layer;
h. patterning the dielectric layer in accordance with the image to define a patterned dielectric layer;
i. depositing a metal into the patterned dielectric layer to form an interconnect structure, the interconnect structure including at least one metallic line corresponding to the line trench segment; and
j. forming at least a second interconnect structure in the dielectric layer, the second interconnect structure including at least at least a second metallic line, and wherein the wing spacer forms a line break in the second metallic line.

20. The method of claim 19 further including:
forming at least a second mandrel layer above the at least one mandrel layer; and
repeating steps (c-i) with the at least a second mandrel layer to form the second interconnect structure;
wherein the wing spacer of the second interconnect structure forms a line break in the second interconnect structure.

* * * * *